United States Patent [19]

Hoisington et al.

[11] Patent Number: 4,814,786

[45] Date of Patent: Mar. 21, 1989

[54] HOT MELT INK SUPPLY SYSTEM

[75] Inventors: Paul A. Hoisington; Nathan P. Hine, both of Norwich; Charles W. Spehrley, Jr., Hartford, all of Vt.

[73] Assignee: Spectra, Inc., Hanover, N.H.

[21] Appl. No.: 43,369

[22] Filed: Apr. 28, 1987

[51] Int. Cl.⁴ .............................................. G01D 9/00
[52] U.S. Cl. ................................. 346/1.1; 346/140 R
[58] Field of Search .............. 346/140 PD, 76 PH, 1.1

[56] References Cited

U.S. PATENT DOCUMENTS

| | | |
|---|---|---|
| 4,490,731 | 12/1984 | Vaught .......................... 346/140 PD |
| 4,593,292 | 6/1986 | Lewis ............................ 346/140 PD |
| 4,607,266 | 8/1986 | DeBonte ...................... 346/140 PD |

FOREIGN PATENT DOCUMENTS 55-54368   1/1980   Japan .

Primary Examiner—E. A. Goldberg
Assistant Examiner—Mark Reinhart
Attorney, Agent, or Firm—Brumbaugh, Graves, Donohue & Raymond

[57] ABSTRACT

In the representative hot melt ink supply system described in the specification, a first hot melt ink supply reservoir maintains ink in molten condition during operation of the system and a second reservoir mounted with an ink jet head on a movable carriage communicates with the first reservoir through a flexible supply line. The ink in the supply line is normally kept in solid condition and, when a reduced level of ink is detected in the second reservoir, the supply line is heated to melt the ink in the line and a pump is actuated to transfer ink from the first reservoir to the second reservoir. To permit use of pigmented inks, each of the reservoirs is heated to provide a thermal gradient therein so as to maintain convective circulation of the ink. An ink circulation path is provided to cause convective circulation of pigmented ink in the ink jet head.

23 Claims, 1 Drawing Sheet

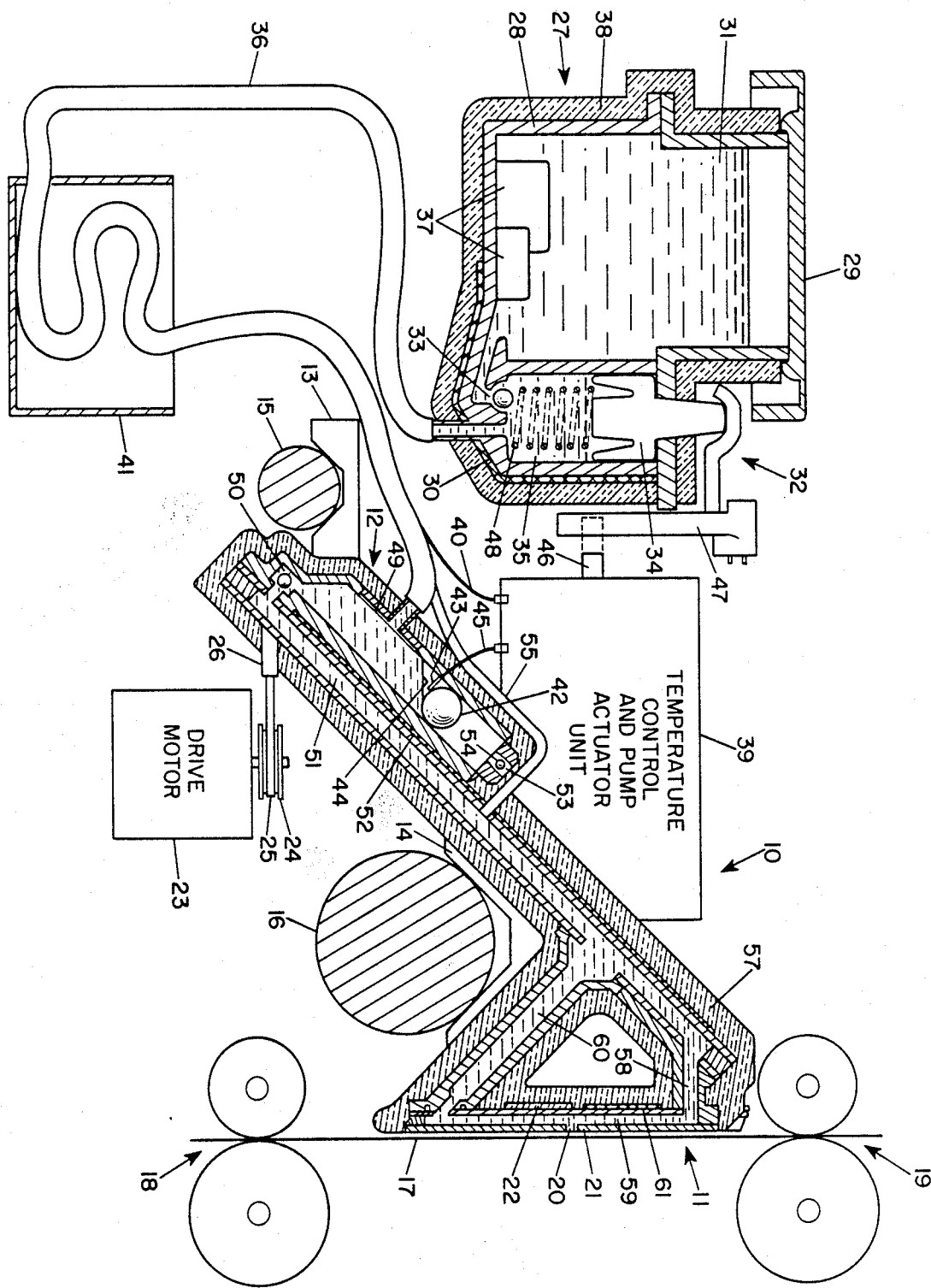

HOT MELT INK SUPPLY SYSTEM

BACKGROUND OF THE INVENTION

This invention relates to hot melt ink supply systems for supplying hot melt ink to an ink jet apparatus and, more particularly, to a new and improved hot melt ink supply system which can be used to supply hot melt pigmented ink.

In hot melt ink jet systems, the ink is delivered to the ink jet apparatus in solid form and must be melted and kept in a molten condition for immediate use by the ink jet head. Normally, this requires the complete ink supply system to be kept at a temperture such as 120° C. at which the ink is maintained in a molten condition, requiring substantial expenditure of energy. Moreover, if the hot melt ink in the apparatus contains an insoluble pigment rather than a soluble dye, the ink must be stirred as long as it is molten in order to avoid undesirable settling of the pigment. Conventional hot melt ink supply systems are generally incapable of avoiding settling of pigment in a pigmented hot melt ink.

Accordingly, it is an object of the present invention to provide a new and improved hot melt ink supply system which overcomes the above-mentioned disadvantages of the prior art.

Another object of the invention is to provide an improved hot melt ink supply system for ink jet apparatus which is especially adapted for use with pigmented hot melt inks.

A further object of the invention is to provide a hot melt ink supply system which is arranged to avoid undesirable settling of pigment from a hot melt ink with minimum energy expenditure.

SUMMARY OF THE INVENTION

These and other objects of the invention are attained by providing a first reservoir adapted to normally maintain a supply of hot melt ink in the molten condition, an ink jet head for ejecting ink in the molten condition to be deposited on a record member, a second reservoir communicating with the ink jet head to supply hot melt ink thereto, a supply line connecting the first and second reservoirs, and a temperature control for the supply line temperature to melt the ink in the supply line when ink is to be transferred from the first reservoir to the second reservoir and permit the ink in the supply line to solidify when no ink is being transferred.

According to one feature of the invention, heaters are arranged in elements of the ink supply system so as to maintain a thermal gradient condition to produce convective circulation of molten ink therein sufficient to counteract any tendency of pigment to settle in a pigmented hot melt ink. According to another aspect of the invention, hot melt ink is maintained in solid condition in an element of the supply system and is melted only when ink is to be transferred by the element. In one embodiment, according to the invention, an ink level detector arranged to detect a low ink volume in the second reservoir causes the temperature control to melt the ink in the supply line and activates a pump to transfer ink through the supply line from the first reservoir to the second reservoir.

BRIEF DESCRIPTION OF THE DRAWING

Further objects and advantages of the invention will be apparent from a reading of the following description in conjunction with the accompanying drawing which is a schematic elevation view, partly in section, illustrating a representative arrangement of a hot melt ink supply system in accordance with the present invention.

DESCRIPTION OF A PREFERRED EMBODIMENT

In the representative embodiment of the invention illustrated by way of example in the drawing, an ink jet apparatus includes a movable carriage assembly 10 comprising an ink jet head 11 and an ink reservoir 12 supported by two shoes 13 and 14 on corresponding fixed rails 15 and 16 for reciprocating motion perpendicular to the plane of the drawing. A web 17 of paper or other image receiving material is carried between two sets of drive rolls 18 and 19 for motion past the ink jet head 11 to receive ink drops 20 ejected through an orifice 21 in a conventional manner by a transducer 22 to form a desired pattern on the web 17. A drive motor 23 having a pulley 24 drives the carriage 10 in a reciprocal manner by means of a belt 25 attached to a lug 26 on the carriage.

An ink supply reservoir 27 mounted in fixed position in the apparatus consists of a tank 28 having a removable cover 29 permitting hot melt ink in solid form to be introduced into the tank where it is melted by a heater 30 affixed to the outer wall of the reservoir tank 28, which is preferably made of a heat conductive material such as metal, to produce a molten ink supply 31. To transfer molten ink from the reservoir 27 to the reservoir 12 mounted on the carriage 10 from which is can be supplied to the ink jet head 11, the reservoir 27 includes a pump 32 which receives ink from the main portion of the reservoir through a check valve 33. The pump has a piston 34 arranged to force molten ink from the pump chamber 35 through a supply line 36 to the reservoir 12 when the plunger 34 is depressed and a draw ink through the check valve 33 into the pump chamber 35 when the plunger 34 is raised.

Although the hot melt ink supply system of the invention is described herein with reference to a single supply reservoir 27 containing ink 31 of a single color and a single carriage reservoir 12 along with one connecting supply line 36, it will be understood that the hot melt ink supply system of the invention is equally applicable to ink jet apparatus in which several different colored inks are used. In that case a corresponding number of supply reservoirs 27, carriage reservoirs 12, pumps 32 and supply lines 36 are provided. In addition, the ink jet head 11 has at least one orifice 21 for each color to be used. Since multicolor ink jet systems are well known, those skilled in the art will readily understand the manner in which the particular embodiment described and illustrated herein can be used with multicolor hot melt ink jet systems.

To facilitate prompt melting of solid ink in the reservoir 27 when fresh solid ink is introduced into the reservoir or when the ink jet apparatus has been turned off for a substantial period of time, such as overnight, so that the ink is solidified, the heater 30 is preferably divided into two or more sections. In this way, maximum power input can be provided to melt solid ink in the reservoir rapidly and reduced heat input can be supplied after the ink has been melted to maintain the reservoir at a desired temperature. In addition, a series of upstanding heat-conducting projections or fins 37 is provided in the bottom of the tank 28 and a layer 38 of heat insulating material encloses the tank and the pump 32. Additional fins may also be formed in the side walls of the tank for the same purpose.

In order to permit the use of pigmented inks in which pigment tends to settle in the absence of stirring, the reservoir 27 is designed to provide convective stirring of the molten ink. For this purpose, the heater 30 is arranged to supply heat on only one side of the reservoir, creating a thermal gradient in the horizontal direction within the reservoir which causes the ink to circulate continuously by convection at a flow rate sufficient to maintain the pigment uniformly in suspension. To assure adequate stirring of the ink, the circulation flow rate should be several times, for example 5 to 10 times, the pigment settling velocity, which is about 1 to 2 millimeters per hour for most pigmented hot melt inks at the temperature of use. This can be accomplished by providing a temperature gradient of approximately 10° C. across the width of the reservoir. In a particular case, the reservoir heater 30 and insulation 38 may be designed so that the ink in the heated side of the reservoir is maintained at about 130° C. and the ink at the opposite side of the reservoir is held at about 120° C. Other temperatures and gradients may be used according to the characteristics of the particular ink being used and the geometry of the reservoir.

A temperature control and pump actuator unit 39, mounted on the carriage 10, is connected through a cable 40 attached to the supply line 36 to the heater 30 and appropriate temperature sensors (not shown) in the reservoir 27. The cable 40 transmits signals from the temperature sensors to the control unit 39 which, in turn, supplies power through the cable to appropriate sections of the heater 30 to maintain the desired temperature conditions. Preferably the ink in the reservoirs 12 and 27 and other components of the system is kept as cool as possible while maintaining a molten condition and a sufficient temperature gradient to assure circulation while the ink in the head 11 is kept at a selected higher temperature appropriate for jet operation.

The cable 40 may also detect the temperature of the ink within the supply line 36 and it includes one or more heater wires by which the control unit 39 causes heat to be applied to the ink within the supply line. Moreover, to accommodate the motion of the carriage 10 with respect to the fixed ink reservoir 27, a tray 41 is provided to hold enough length of the supply line 36 and its attached cable 40 to permit the carriage 10 to move from one end of its travel to the opposite end.

To permit the hot melt ink supply system to be used with pigmented hot melt inks as described above, the system is arranged to prevent settling of pigment in the ink contained in the supply line 36 when it is not moving. Since it is not possible to provide convective circulation of the ink in the supply line, settling of pigment from the ink in the line is prevented by maintaining the ink in a solid condition at all times except when it is necessary to transfer ink from the main reservoir 27 to the reservoir 12 on the carriage 10. For this purpose, the control unit 39 normally maintains the temperature of the ink in the supply line 36 at a level below the melting point of the hot melt ink, such as 50° C., so that the ink will be solid but can be melted quickly, and raises the temperature above the melting point only when transfer of ink is required. If no temperature sensors are provided in the cable 36, the control unit 39 merely energizes the heater wires in the cable 40 sufficiently to melt the ink when transfer is required and shuts off power to the heater wires when the transfer has been completed.

A low ink level detector is provided in the reservoir 12 to determine when transfer of ink is required. The detector comprises a floating ball 42 arranged to engage a contact 43 when the level 44 of the ink in the reservoir 12 is below a desired value. The contact 43 transmits a signal by way of a cable 45 to the temperature control unit 39, which then supplies sufficient power to the supply line heating wires in the cable 40 to melt ink in the supply line 36, thereby permitting ink to be transferred through the supply line from the reservoir 27 to the reservoir 12.

When the ink in the supply line 36 has been melted, the temperature control and pump actuator unit 39 causes a projecting pump actuator pin 46 to be extended far enough, as shown in the dotted outline outline in the drawing, that it engages a pump actuating lever 47. As a result, when the carriage 10 is at one end of its path of travel on the rails 15 and 16, operation of the pump lever 47 causes the plunger 34 to be moved downwardly in the chamber 35, transferring molten ink through the heated supply line 36 to the reservoir 12. When the carriage moves away, the plunger 34 and lever 47 are restored to the illustrated positions by a spring 48 in the chamber 35. If desired, the plunger may be restored by the return motion of the carriage 10 acting through the lever 47 and a mechanical connection to the plunger 34 rather than by a spring. Preferably, the quantity of ink transferred by the pump during this operation fills the reservoir 12 with enough ink to permit operation of the ink jet for a substantial period of time sufficient, for example, a print several pages of text. Accordingly, after the ink has been transferred, the temperature of the ink in the supply line is permitted by the control unit 39 to fall below its melting point so that it is solidified to foreclose pigment settling in the ink in the supply line.

To trap any foreign matter which may have been introduced into the supply reservoir 27 and passed through the supply line 36, a planar micromesh filter screen 49 is mounted in the upper wall of the reservoir to cover the inlet from the supply line. The filter screen, which may be an interwoven or electroform mesh, has openings large enough to pass the pigment particles in a pigmented ink. A check valve 50 at the bottom of the reservoir 12 permits ink to pass out of the reservoir into a deaeration passage 51, but prevents ink from moving back into the reservoir from the deaeration passage.

As illustrated in the drawing, the reservoir 12 may be inclined at an angle between vertical and horizontal and a heater 52 is mounted on one wall of the reservoir in such a way that the ink within the reservoir circulates by convection at a rate sufficient to maintain a pigment in the ink within the reservoir in suspension. For this purpose, the cable 45 connecting the reservoir 12 with the temperature control unit 39 may provide indications of temperature at selected locations in the reservoir and supply current to the heater 52 in such a way as to maintain desired temperature differences. The heater 52 may be made in several sections permitting a high heat output to melt ink in the reservoir 12 and the dearation passage 51 on start-up and reduced heat output sufficient to maintain ink in a molten condition and convectively circulate the ink therein during operation of the system.

In a reservoir of the type illustrated in the drawing having a length of about 2 inches and a width of about ¼ inch, a 5° C. temperature difference from one side of the reservoir to the other should be sufficient to maintain pigment in suspension in a typical ink within the reservoir. At the top of the reservoir 12, an air vent 53 is provided to maintain the ink within the reservoir at atmospheric pressure as the reservoir is filled and emptied. To prevent leakage of ink out of the reservoir in the event that the carriage 10 is inverted, a sinking ball 54 is arranged to close the air vent 53 in the inverted position. Alternatively, if desired, a baffle arrangement may be used to close the vent.

In order to remove all dissolved air from the ink before it reaches the ink jet head 11 where it might produce air bubbles and interfere with the operation of the ink jet head, the deaerator passage 51 is arranged as described in the copending application of Paul A. Hoisington et al. Ser. No. 043,732, filed Apr. 28, 1987, entitled "Dearation of Ink in an Ink Jet System" and assigned to the same assignee as the present application. Briefly, the deaerator passage 51 is formed with air permeable walls backed by plenums to which an air supply line 55 is connected. Negative air pressure is normally supplied to the plenums through the line 55 so as to extract dissolved air from the ink within the passage 51 and a positive pressure pulse may also be applied to eject ink from the head 11 which may contain air bubbles formed when the apparatus is not operating. In addition, the heater 52 which is adjacent to the upper wall of the dearation 51 causes convective circulation of the ink within the deaerator passage and thereby prevents settling of pigment from a pigmented ink within the passage. The ink jet head 11, along with the deaerator 51 and the reservoir 12, may be surrounded by a layer 57 of heat insulating material.

The ink jet head 11 is also designed to maintain convective circulation of ink and thereby avoid settling of pigment if a pigmented ink is used. For this purpose, the head 11 has a closed loop ink path including a generally horizontal passage 58 connected to the upper end of the passage 51, a generally vertical ink passage 59 leading past the orifice 21 and the transducer 22, and an inclined passage 60 leading from the bottom of the vertical passage 59 to the passage 51 at a point below the connection to the passage 58. A heating element 61, controlled by the temperature control unit 39, is mounted on the wall of the passage 59 and the temperature of the ink within that passage is maintained high enough with respect to the temperature of the ink within the passage 51 so that, when no ink is being jetted by the ink jet head, continuous convective circulation of the ink is maintained upwardly through the passage 59, across the passage 58 and downwardly through the deaerator passage 51 and the passage 60 at a rate sufficient to prevent settling of pigment in a pigmented ink. As described in the above-mentioned Hoisington et al. application, this circulation also transports ink, which may have dissolved air through the orifice 21, from the passage 59 to the deaerator passage 51.

In operation, when the hot melt ink supply system using a pigmented ink is started up from a cold condition, pigmented hot melt ink in solid form is placed in the reservoir 27 and the heater 30, under the control of the control unit 39, applies a maximum heat input to the reservoir to melt that ink and any solidified ink remaining in the reservoir. Thereafter, the heat input is set by the control unit 39 at a level sufficient to maintain convective circulation in the reservoir to keep pigment in a pigmented ink therein in suspension. At this time, the ink in the supply line 36 remains solidified to prevent settling of pigment in that ink.

Similarly, solidified ink in the reservoir 12 and the deaerator passage 51 is heated by the heater 52 to melt it and then maintain convective circulation in the reservoir 12 and the passage 51 to keep the pigment in a pigmented ink therein in suspension. When the ball 42 engages the contact 43, indicating a low ink level in the reservoir 12, the control unit 39 causes the ink in the supply line 36 to be melted by the heater in the cable 40 and actuates the pump 32 to transfer molten ink from the reservoir 27 through the line 36 to the reservoir 12. When the ink transfer is completed, the supply line is permitted to cool, solidifying the ink and preventing settling of pigment.

In the ink jet head 11, the heater 61 causes convective circulation of ink upwardly in the passage 59 and downwardly in the upper part of the passage 51 and in the passage 60. This maintains pigment in a pigmented ink in suspension when the ink jet head is not operating to eject ink through the orifice 21.

Although the invention has been described herein with reference to a specific embodiment, many modifications and variations therein will readily occur to those skilled in the art. Accordingly, all such variations and modifications are included within the intended scope of the invention as defined by the following claims.

We claim:

1. A hot melt ink supply system for an ink jet apparatus comprising ink jet head means for ejecting molten ink to be deposited on a record member, first ink reservoir means for receiving hot melt ink, heater means for normally maintaining the ink in the first ink reservoir means in a molten condition independently of the operation of the ink jet head means, second reservoir means associated with the ink jet head means for normally maintaining ink in a molten condition and for supplying molten ink to the ink jet head, supply line means connecting the first and second reservoir means for transferring molten ink from the first reservoir means to the second reservoir means as required during operation of the system, and temperature control means for controlling the temperature of the ink in the supply line means so as to normally maintain the ink therein in a relatively solid condition and to heat the ink therein to a molten condition when transfer of ink from the first reservoir means to the second reservoir means is required.

2. A hot melt ink supply system according to claim 1 including pump means for transferring molten ink from the first reservoir means to the second reservoir means.

3. A hot melt ink supply system according to claim 2 including detector means in the second reservoir means for detecting a decrease in the supply of ink therein to a selected level, and control means responsive to detection of a decreased level of ink in the second reservoir means to increase the supply line temperature to render the ink therein molten and to actuate the pump means to transfer ink from the first reservoir means to the second reservoir means.

4. A hot melt ink supply system for an ink jet apparatus comprising first ink reservoir means for receiving hot melt ink and normally maintaining the ink in a molten condition during operation of the apparatus, ink jet head means for ejecting molten ink to be deposited on a record member, second reservoir means associated with the ink jet head means for normally maintaining ink in a molten condition and for supplying molten ink to the ink jet head, supply line means connecting the first and second reservoir means for transferring molten ink from the first reservoir means to the second reservoir means periodically during operation of the system, temperature control means for controlling the temperature of the ink in the supply line means so as to normally maintain the ink therein in a relatively solid condition and to heat the ink therein to a molten condition when transfer of ink from the first reservoir means to the second reservoir means is required, and heater means for heating ink in the first reservoir means wherein the heater is arranged to provide a thermal gradient in the ink within the first reservoir means so as to cause convective circulation of the ink therein sufficient to maintain pigment in a pigmented hot melt ink in suspension.

5. A hot melt ink supply system for an ink jet apparatus comprising first ink reservoir means for receiving hot melt ink and normally maintaining the ink in a molten condition during operation of the apparatus, ink jet head means for ejecting molten ink to be deposited on a record member, second reservoir means associated with the ink jet head means for normally maintaining ink in a molten condition and for supplying molten ink to the ink jet head, supply line means connecting the first and second reservoir means for transferring molten ink from the first reservoir means to the second reservoir means periodically during operation of the system, and temperature control means for controlling the temperature of the ink in the supply line means so as to normally maintain the ink therein in a relatively solid condition and to heat the ink therein to a molten condition when transfer of ink from the first reservoir means to the second reservoir means is required, wherein the second reservoir means includes an elongated ink container oriented at an angle intermediate between vertical and horizontal and including heater means mounted adjacent one side of the container so as to cause convective circulation therein sufficient to maintain pigment in a pigmented hotmelt ink in suspension.

6. A hot melt ink supply system for an ink jet apparatus comprising first ink reservoir means for receiving hot melt ink and normally maintaining the ink in a molten condition during operation of the apparatus, ink jet head means for ejecting molten ink to be deposited on a record member, second reservoir means associated with the ink jet head means for normally maintaining ink in a molten condition and for supplying molten ink to the ink jet head, supply line means connecting the first and second reservoir means for transferring molten ink from the first reservoir means to the second reservoir means periodically during operation of the system, and temperature control means for controlling the temperature of the ink in the supply line means so as to normally maintain the ink therein in a relatively solid condition and to heat the ink therein to a molten condition when transfer of ink from the first reservoir means to the second reservoir means is required, wherein the ink jet head means includes an orifice through which ink is ejected and an ink flow path communicating with the orifice and including ink passage means communicating with the ink flow path to provide, in combination with the in flow path, a closed loop circulation path for ink, and heating means for heating a portion of the closed loop circulation path to cause convective circulation of ink therein at a rate sufficient to maintain pigment in a pigmented hot melt ink in suspension.

7. A hot melt ink supply system for an ink jet apparatus comprising first ink reservoir means for receiving hot melt ink and normally maintaining the ink in a molten condition during operation of the apparatus, ink jet head means for ejecting molten ink to be deposited on a record member, second reservoir means associated with the ink jet head means for normally maintaining ink in a molten condition and for supplying molten ink to the ink jet head, supply line means connecting the first and second reservoir means for transferring molten ink from the first reservoir means to the second reservoir means periodically during operation of the system, temperature control means for controlling the temperature of the ink in the supply line means so as to normally maintain the ink therein in a relatively solid condition and to heat the ink therein to a molten condition when transfer of ink from the first reservoir means to the second reservoir means is required, and deaerator means comprising an elongated ink passage communicating adjacent one end with the second reservoir means and adjacent the other end with the ink jet head means, and heater means disposed adjacent to one wall of the deaerator means so as to cause convective circulation of the ink therein at a rate sufficient to maintain pigment in a pigmented hot melt ink in suspension.

8. A hot melt ink supply system according to claim 1 including carriage means for supporting the second reservoir means for motion relative to the first reservoir means and wherein at least a portion of the supply line means is flexible to permit relative motion between the first reservoir means and the second reservoir means.

9. A hot melt ink supply system according to claim 1 including carriage means for supporting the second reservoir means and the ink jet head means for reciprocating motion relative to the first reservoir means, detector means for detecting a relatively low level of ink in the second reservoir means, pump means for transferring ink from the first reservoir means to the second reservoir means, and pump actuator means responsive to detection of a low level of ink in the second reservoir means for causing motion of the carriage means to actuate the pump means to transfer ink from the first reservoir means to the second reservoir means.

10. A hot melt ink supply system for an ink jet apparatus comprising ink jet head means for ejecting molten ink to be deposited on a record member, first ink reservoir means for receiving hot melt ink, heater means for normally maintaining the ink in the first reservoir means in a molten condition independently of the operation of the ink jet head means, second reservoir means associated with the ink jet head means for normally maintaining ink in a molten condition and for supplying molten ink to the ink jet head, supply line means connecting the first and second reservoir means for transferring molten ink from the first reservoir means to the second reservoir means as required during operation of the system, detector means in the second reservoir means for detecting a decrease in the supply of ink therein to a selected level, and control means responsive to detection of a decreased level of ink in the second reservoir means to initiate transfer of ink from the first reservoir means through the supply line means to the second reservoir means by melting the ink in the supply line means.

11. A hot melt ink supply system in accordance with claim 10 wherein the ink in the supply line means is normally maintained in solid condition and wherein the control means causes an increase in the temperature of the ink in a supply line means to render the ink therein molten to permit transfer of ink from the first reservoir means to the second reservoir means.

12. A hot melt ink supply system comprising a reservoir for holding molten hot melt ink, ink jet means for ejecting molten hot melt ink, supply line means through which hot melt ink is transferred from the reservoir to the ink jet means as required by the ink jet means, and temperature control means for maintaining all of the ink in the reservoir in a molten condition and melting the ink in the supply line means at times when ink is to be transferred therethrough and permitting the ink therein to solidify when transfer is not required.

13. A hot melt ink supply system for an ink jet apparatus comprising a system component for holding molten hot melt ink and heater means for applying heat to ink in the system component to produce convective circulation therein, thereby maintaining pigment in a pigmented ink in suspension.

14. A hot melt ink supply system for an ink jet apparatus comprising a system component for holding molten hot melt ink and temperature control means for causing thermal gradient in ink in the system component to produce convective circulation therein, thereby maintaining pigment in a pigmented ink in suspension.

15. In a hot melt ink supply system for an ink jet apparatus having reservoir means for receiving hot melt ink and normally maintaining the ink in molten condition during operation of the apparatus, heater means for heating a selected portion of the reservoir means to provide a thermal gradient in the ink therein and thereby cause convective circulation of the ink sufficient to maintain pigment in a pigmented ink in suspension.

16. A hot melt ink supply system according to claim 15 wherein the reservoir means comprises a container having fin means projecting from the container into the interior of the reservoir means to conduct heat directly to ink within the interior of the reservoir means.

17. A hot melt ink supply system in accordance with claim 15 wherein the reservoir means comprises an elongated container and the heater means is disposed adjacent one side wall of the container.

18. In a hot melt ink supply system including ink jet head means having an orifice through which ink is ejected and an ink flow path communicating with the orifice, ink passage means communicating with the ink flow path to provide, in combination with the ink flow path, a closed loop circulation path for ink, and heating means for heating a portion of the closed loop circulation path to provide convective circulation of the ink therein at a rate sufficient to maintain pigment in the pigmented hot melt ink in suspension.

19. A method for preventing settling of pigment in pigmented hot melt ink in a hot melt ink supply system comprising melting hot melt ink in the supply system, maintaining a first portion of the ink in the system in molten condition, and subjecting the molten ink to a temperature gradient, thereby providing convective circulation therein.

20. A method according to claim 19 including normally maintaining a second portion of the ink in the system in solid condition to prevent settling of pigment therein.

21. A method for supplying hot melt ink to an ink jet head comprising maintaining a supply of hot melt ink in molten condition in a supply reservoir spaced from the ink jet head, maintaining hot melt ink in a second reservoir communicating with the ink jet head in molten condition to supply ink to the ink jet head during operation thereof, transferring molten ink through a supply line from the suply reservoir to the second reservoir as required, and permitting the ink in the supply line to solidify when ink is not being transferred therethrough while maintaining the ink in the supply reservoir in molten condition.

22. A method for preventing settling of pigment in a pigmented hot melt ink in an ink jet apparatus comprising maintaining the hot melt ink in molten condition in a reservoir, and applying heat to a selected portion of the reservoir to cause convective circultion of the ink within the resevoir at a rate sufficient to prevent settling of pigment from the ink.

23. A method for maintaining pigment in a pigmented hot melt ink in suspension in an ink jet head having an orifice to eject ink comprising supplying hot melt ink to a first ink path communicating with the orifice, supplying hot melt ink to a second ink path communicating with the first ink path to form, together with the first path, a closed loop ink path, and heating a portion of the closed loop ink path to cause convective circulation of ink through the closed loop path and thereby prevent settling of pigment from a pigmented hot melt ink therein.

* * * * *

UNITED STATES PATENT AND TRADEMARK OFFICE
CERTIFICATE OF CORRECTION

PATENT NO. : 4,814,786

DATED : March 21, 1989

INVENTOR(S) : Paul A. Hoisington et al.

It is certified that error appears in the above-identified patent and that said Letters Patent is hereby corrected as shown below:

Column 1, line 14: The word "temperture" should read --temperature--.

Column 4, line 31: The words "a print" should read --to print--; line 60: The word "dearation" should read --deaeration--.

Column 5, line 16: The word "Dearation" should read --Deaeration--; line 27: The word "dearation" should read --deaerator--.

Column 7, line 37: The word "hotmelt" should read --hot melt--; line 60: The words "in flow" should read --ink flow--.

Column 10, line 2: The words "in the" should read --in a--; line 22: The word "suply" should read --supply--; line 32: The word "resevoir" should read --reservoir--.

Signed and Sealed this

Twentieth Day of March, 1990

Attest:

JEFFREY M. SAMUELS

*Attesting Officer*   *Acting Commissioner of Patents and Trademarks*

UNITED STATES PATENT AND TRADEMARK OFFICE
CERTIFICATE OF CORRECTION

PATENT NO. : 4,814,786

DATED : Mar. 21, 1989

INVENTOR(S) : Nathan P. Hine et al.

It is certified that error appears in the above-identified patent and that said Letters Patent is hereby corrected as shown below:

Cover Page, under Item [75]: "Hoisington et al." should be --Hine et al.--;

Cover Page, Item [75], line 1: The names "Paul A. Hoisington; Nathan P. Hine," should read --Nathan P. Hine; Paul A. Hoisington,--.

Signed and Sealed this

Thirtieth Day of April, 1991

Attest:

HARRY F. MANBECK, JR.

*Attesting Officer*    *Commissioner of Patents and Trademarks*